US007969203B1

(12) United States Patent
Wu et al.

(10) Patent No.: US 7,969,203 B1
(45) Date of Patent: Jun. 28, 2011

(54) SWITCH-BODY PMOS SWITCH WITH SWITCH-BODY DUMMIES

(75) Inventors: Qiong Wu, San Jose, CA (US); Kevin Mahooti, San Jose, CA (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 12/630,662

(22) Filed: Dec. 3, 2009

(51) Int. Cl.
*G11C 27/02* (2006.01)
(52) U.S. Cl. ............................................. 327/94; 327/91
(58) Field of Classification Search .................... 327/91, 327/94, 97; 341/122
See application file for complete search history.

(56) References Cited

U.S. PATENT DOCUMENTS

| | | | |
|---|---|---|---|
| 4,308,468 A * | 12/1981 | Olson | 327/94 |
| 5,019,731 A * | 5/1991 | Kobayashi | 327/434 |
| 5,111,072 A * | 5/1992 | Seidel | 327/94 |
| 6,265,911 B1 * | 7/2001 | Nairn | 327/94 |
| 7,015,729 B1 * | 3/2006 | Tursi et al. | 327/94 |
| 7,119,585 B2 * | 10/2006 | Ranganathan | 327/94 |

* cited by examiner

*Primary Examiner* — Hai L Nguyen

(57) ABSTRACT

An analog sample-and-hold switch has parallel branches extending from an input node to an output node connected to a hold capacitor, each branch having a PMOS signal switch FET in series with a PMOS dummy FET. A sample clock controls on-off switching of the PMOS signal switch FETs, and an inverse of the sample clock controls a complementary on-off switching of the PMOS dummy FETs. A bias sequencer circuit biases the PMOS signal switch FETs and biases the PMOS dummy FETs, in a complementary manner, synchronous with their respective on-off states. The on-off switching of the PMOS dummy FETs injects charge cancelling a charge injection by the PMOS signal switch FETs, and injects glitches cancelling glitches injected by the PMOS signal switch FETs.

14 Claims, 5 Drawing Sheets

SWITCH-BODY PMOS SWITCH WITH SWITCH-BODY DUMMIES

TECHNICAL FIELD

The technical field relates generally to circuits for sampling and holding an instantaneous value of a time-varying electrical signal.

BACKGROUND

A sample-and-hold circuit receives an electrical signal with one or more time varying attributes such as, for example, amplitude or phase and, in response to a sampling command event such as, for example, a clock edge, takes and holds a sample of the signal.

Sample and hold devices (hereinafter referenced generically as "S/H device(s)"), are used in a wide range of applications such as, for example, a pre-sampler within, or preceding a front end of an analog-to-digital converter ("ADC"), typically to present a value to the comparators of the ADC that is reasonably stationary for long enough to meet a set-up and hold time requirement of the ADC, or a "de-glitches" installed at the output of a digital-to-analog converter ("DAC"), typically to sample the DAC output at some time after the DAC clock and thus hold a steady-state analog signal level.

The sample that is held by the S/H device is, ideally, the instantaneous value of the signal that exists exactly at a given point in physical space at a given instant of time, e.g., the signal value at a sampling terminal of the S/H device at an infinitely precise time relative to an infinitely precise clock.

It has been long known, however, to persons of ordinary skill in the arts pertaining to S/H devices that actual operating S/H devices suffer from various non-ideal characteristics by which the actual sample at a given time after the sampling instant is not, in fact, the exact value of the input signal that was extant at that instant. These non-ideal characteristics include, for example, sampling jitter, meaning the statistical variance of the time difference between the ideal hold clock event and the instant that the S/H actually holds the sampled value; acquisition time, meaning the time required for the S/H device to charge the hold capacitor to the sampled signal value; as well as charge injection; clock feedthrough and pedestal error.

Various known methods are directed to reducing or compensating, at least in part, one or more of the above-identified non-ideal characteristics of actual S/H devices.

For example, the simplest signal switch component of an S/H device is a single transistor fabricated by a MOS process, such as a PMOS FET or NMOS FET. Each of the PMOS FET and NMOS FET is controlled by a clock signal that swings between the MOS supply voltage $V_{DD}$ and the system ground. An inherent problem faced by a single transistor PMOS FET or NMOS FET structure is that each requires a threshold gate-to-source voltage, generally termed $V_{TH}$, to switch on, meaning to form a conducting channel extending under the gate from the source to the drain. The lowest signal voltage that can be transferred by a PMOS device is therefore equal to $0+V_{TH}$, and the highest voltage for an NMOS device is therefore equal to $V_{DD}-V_{TH}$.

To avoid this inherent shortcoming, and to provide other benefits known in the arts pertaining to S/H devices, the complementary MOSFET (CMOS) switch was introduced. CMOS switch S/H devices are well known in the S/H arts, as they were introduced decades ago. A typical CMOS switch includes a PMOS FET and an NMOS FET, connected parallel to one another with source-to-source and drain-to-drain connections. One ON-OFF S/H signal, typically termed a clock or CLK is connected to the PMOS FET gate and the complement of that CLK, which may be termed NCLK, is connected to the NMOS FET gate. The PMOS and NMOS FETs therefore turn ON and OFF concurrently, subject to time differences between the edges of the CLK and NCLK.

Related art CMOS switch S/H devices also have inherent shortcomings, though, including, as an illustrative example, a signal-dependent ON resistance of the CMOS switch, which in turn produces an inherent non-linearity.

Methods that have been, or are directed at this inherent non-linearity of CMOS switches have been long used and longer known. All have also been long known as having significant shortcomings. For example, one such method is to boost the gate control voltage "$V_G$" to lower the "$(V_G-V_S)/V_S$" variation caused by the signal variation at the source "$V_S$" of the MOS switch. This method imposes costs, and has other non-ideal characteristics such as, for example, limited effectiveness and increased risks of accelerated device failure due to the higher the gate control signal level.

Another of these methods, often referenced as the "bootstrap" method, makes the gate voltage follow the analog input signal with an offset to turn the switch ON and to keep "$V_{GS}$" constant, thereby maintaining a somewhat constant ON resistance. However, the offset voltage must be high enough to turn the switch ON with low on-resistance but, at the same time, must be low enough to limit the stress added on the gate to be lower than the breakdown level.

Another limitation of the bootstrap method, which has been long known in the arts pertaining to S/H devices, is that the bootstrap circuitry controls "$V_{GS}$", but provides nothing to control the source-to-body voltage dependence, or $V_{SB}$ dependence of the MOS devices on-resistance in the CMOS switch, which is another linearity error source. Conventional methods directed to reducing "$V_{SB}$" related linearity error include forcing the error to zero by shorting the body terminals of MOS FETs to their source terminals while in the sample mode. These and other methods, though, have been long known as not attaining acceptable S/H device performance for many applications.

SUMMARY

Sample and hold devices according to one example first embodiment include a unique and novel combination and arrangement of parallel signal paths from an input node to an output node connecting a holding capacitor, each signal path having a PMOS signal switch FET, each PMOS signal switch FET having a source terminal and a drain terminal, the first PMOS signal switch FET in the first signal path connecting its source to the input node and connecting its drain to the holding capacitor, the second PMOS signal switch FET in the second signal path connecting its drain to the input node and connecting its source to the holding capacitor.

According to one aspect of one example first embodiment, each of the first and the second PMOS signal switch FETs having a gate receiving a clock (CLK) signal switching the PMOS signal switch FETs between the sampling state, in which the CLK signal is at GND, thereby turning the first and the second PMOS signal switch FETs ON to connect the input node to the holding capacitor, and the hold state, in which the CLK is at $V_{DD}$, thereby switching the first and the second PMOS signal switch FETs OFF to disconnect the input node from the holding capacitor.

Sample and hold devices according to one example second embodiment include two PMOS dummy FETs, each PMOS dummy FET locating in each signal path, the first PMOS dummy FET in series with the first PMOS signal switch FET arranged between the input node and the source of the first PMOS switch FET in the first signal path, and the second PMOS dummy FET in series with the second PMOS signal switch FET arranged between the output node and the source of the second PMOS switch FET in the second signal path.

According to one aspect of one example second embodiment, each of the first and the second PMOS dummy FETs having a gate receiving an inverse clock signal (NCLK) of the CLK, causing a complementary switching OFF of the first and the second PMOS dummy FETs concurrent with switching ON of the first and the second PMOS signal switch FETs in the sampling state, and switching ON of the first and the second PMOS dummy FETs concurrent with switching OFF of the first and the second PMOS signal switch FETs in the hold state.

Sample and hold devices according to one example third embodiment include each of the first and the second PMOS signal switch FETs having a body connection connected to, and biased by, a bias sequencer having a certain sequence of specific and different bias levels, and the sequence being synchronized with the CLK signal.

According to one aspect of one example third embodiment, the certain sequence of specific and different bias levels includes, during the sampling interval, in which the CLK signal is at GND, connecting and therefore biasing the body of the first PMOS signal switch FET, and the body of the second PMOS signal switch FET, to the input signal, concurrent with the first and the second PMOS signal switch FETs switched ON to connect: the input node to the holding capacitor.

Among other features and benefits, this one aspect of one example third embodiment reduces the "on-resistance" of the first and the second PMOS signal switch FETs and, further, removes the first-order nonlinearity error due to the body effect.

According to one aspect of one example third embodiment, the certain sequence of specific and different bias levels includes, during the holding interval, in which the CLK is at $V_{DD}$, connecting and therefore biasing the bodies of the first and the second PMOS signal switch FETs to $V_{DD}$ concurrent with the first and the second PMOS signal switch FETs switched OFF to isolate the input node from the holding capacitor.

Among other features and benefits, this one aspect, namely biasing the bodies of the first and the second PMOS signal switch FETs to the $V_{DD}$ during the hold mode, significantly increases the hold mode isolation between the input node and the output node, and any holding capacitor connected to the output node.

Sample and hold devices according to one example fourth embodiment include each of the first and the second PMOS dummy FETs having a body connection connected to, and biased by, a bias sequencer having a certain sequence of specific and different bias levels, and the sequence being synchronized with the NCLK signal.

According to one aspect of one example fourth embodiment, the certain sequence of specific and different bias levels includes, during the sampling interval, in which the NCLK signal is at $V_{DD}$, connecting and therefore biasing the body of the first PMOS dummy FET, and the body of the second PMOS dummy switch FET, to the $V_{DD}$, concurrent with the first and the second PMOS dummy FETs switched OFF.

According to one aspect of one example fourth embodiment, the certain sequence of specific and different bias levels includes, during the holding interval, in which the NCLK is at GND, connecting and therefore biasing the bodies of the first and the second PMOS dummy FETs to the voltage level held on the sampling capacitor, same as the voltage showing at the input node in the sampling interval, concurrent with the first and the second PMOS dummy FETs ON.

Among other features and benefits, this one aspect of one example second and fourth embodiments, namely applying a gate control and a body bias to the PMOS dummy FETs opposite to the gate control and the body bias applied to the PMOS signal switch FETs provides significant reduction of the channel charge injection effect and the clock feedthrough effect, providing further reduction in non-linearity error.

As will be described in greater detail at later sections, preferably the first PMOS signal switch FET has approximately the same geometry, the performance-related dimensions and the physical implementation orientation as the second PMOS signal switch FET, and in the first branch, the first dummy PMOS FET has approximately the same geometry, the performance-related dimensions and the physical implementation orientation as the first PMOS signal switch FET, and in the second branch, the second dummy PMOS FET has approximately the same geometry, the performance-related dimensions and the physical implementation orientation as the second PMOS signal switch FET. As will also be described in greater detail in later sections, preferably the CLK and the NCLK are generated to be synchronous.

The above-summarized illustrative examples of embodiments and of illustrations, as well as the above illustrative advantages, features and benefits of each are not intended to be exhaustive or limiting. Other advantages of the various exemplary embodiments will be apparent from the various embodiments and aspects that are further described with illustrative detail, and persons of ordinary skill in the art will, upon reading this disclosure, readily identify further variations within the scope of the appended claims, as well as additional applications.

DETAILED DESCRIPTION

Figure 1:
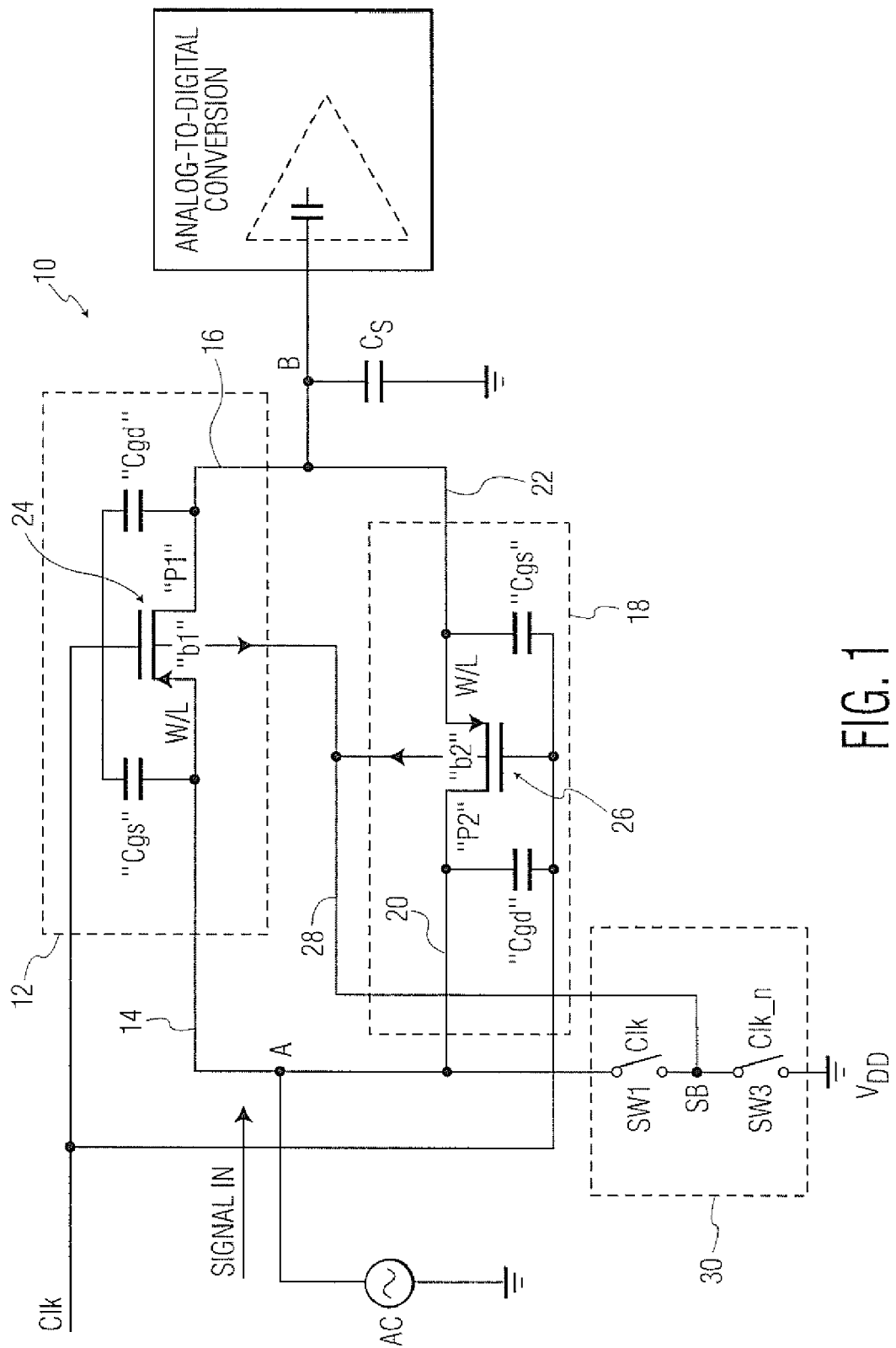
FIG. 1 is a circuit, diagram representation of one example implementation of one switched body PMOS S/H switch according to one or more embodiments.

Various examples having one or more exemplary embodiments are described in reference to specific example configurations and arrangements. The specific examples are only for illustrative purposes, selected to further assist a person of ordinary skill in the art of sample-and-hold circuits to form an understanding of the concepts sufficient for such a person, applying the knowledge and skills such person possesses, to practice the invention. Neither the scope of the embodiments and the range of implementations, however, are limited to these specific illustrative examples. On the contrary, as will be recognized by persons of ordinary skill in the sample-and-hold arts upon reading this description, other configurations, arrangements and implementations practicing one or more of the embodiments, and one or more various aspects of each, may be designed and constructed.

The figures are arranged to provide a clear depiction of the figure's illustrated example subject matter and, further, graphical symbols and content may be arbitrarily placed, and may not be drawn to scale. Relative sizes and placements of items therefore do not necessarily represent the items' relative quantity of structure, or relative burden or importance of functions.

As will also be understood by persons of ordinary skill in the sample-and-hold arts upon reading this disclosure, various background details of, for example, semiconductor design rules and layout methods, semiconductor fabrication methods, and circuit simulation tools that are well known to such persons are omitted, to avoid obscuring novel features and aspects. Similarly, at instances at which details are included, it will be readily understood by such persons of ordinary skill, from the context of the instance, that the details may not be complete and, instead, may only be described to the extent pertinent to particular features and aspects of an embodiment.

Example embodiments and aspects may be described separately, and as having certain differences. Separate description or description of differences, however, does not necessarily mean the respective embodiments or aspects are mutually exclusive. For example, a particular feature, function, or characteristic described in relation to one embodiment may be included in, or adapted for other embodiments.

With respect to the meaning of the terms "ON and "OFF" that appear in this description, each of these terms define relative states and/or functions and in no way limit the practice of the embodiments, or the scope of the appended claims from covering alternative equivalents such as, for example, a global inverse of the described states and functions to perform the same or equivalent functions within the scope and spirit of the invention.

Further regarding the terms "ON" and "OFF", for consistency in terminology describing the illustrative examples, the following meanings apply, unless otherwise stated or made clear from the particular context to have a different meaning: in relation to depicted switches having an open position (or state) and a closed position (or state), the term "ON" means the switch is closed and the term "OFF" means the switch is open. In relation to the depicted FETs, the term "ON" means the FET is in a fully conducting state, between its source and drain, and the term "OFF" means the FET is in an open state, where "fully conducting" and "open" have their ordinary and customary meaning in the art in the context of the described function to which "ON" and "OFF" pertain. With respect to the disclosed clocks and other control signals, the term "ON" means a clock or signal state causing the FETs or other switches controlled by that clock to be ON, and the term "OFF" means a clock or signal state causing the FETs or other switches controlled by that clock to be OFF.

Referring now to the figures, illustrative examples of and from among the various arrangements, architectures, systems and structures for practicing one or more of the various example embodiments will be described.

Turning first to FIG. 1, this shows a circuit diagram representing one example implementation of a PMOS FET based S/H feed switch 10 according to one or more embodiments. As shown, the example 10 includes a first branch 12 having at one end an input line 14 connected to an input node A and, at an opposite end, an output line 16 connected to an output node B. The input node A is shown as receiving a Signal_In from an external signal source (illustrated, but not separately numbered), and the output node B is shown at the top of a holding capacitor Cs. An illustrative example connection of an A/D converter is shown, but not separately number. The example S/H feed switch 10 further includes a second branch 18, parallel to the first branch, having at one end an input line 20 connected to the input node A, and at its opposite end an output line 22 connected to the output node B.

With continuing reference to FIG. 1, the example first branch 12 includes a first PMOS signal switch FET 24 and, likewise, the illustrative example second branch 18 includes a second PMOS signal switch FET 26. Each of the first and the second PMOS signal switch FETs 24 and 26 has respective body connections, labeled "b1" and "b2," respectively, each connecting to the respective transistor body (the body being represented as existing by the FET symbol, but not shown in detail or separately numbered in FIG. 1). Each of the first and the second PMOS signal switch FETs 24 and 26 has a respective source (not separately numbered) and a respective drain (not separately numbered). As also shown, a switching PMOS body bias supply line 28 connects a PMOS switch bias node, arbitrarily labeled "SB" and within a PMOS body bias sequencer circuit 30 that is described in greater detail below, to the body connections b1 and b2 of the first and the second PMOS signal switch FETs 24 and 26. The PMOS body bias sequencer circuit 30 receives a sample-and-hold clock signal, arbitrarily labeled for this description as CLK, and an inversion of that CLK, arbitrarily labeled as NCLK, as well as the CMOS supply voltage $V_{DD}$ and the Signal_In from the input node A. One example generation of CLK and NCLK is described in greater detail at later sections.

The overall function of the FIG. 1 example PMOS body bias sequencer circuit 30 is to output the voltage of the Signal_In signal from the PMOS switch bias node SB during the sample mode, i.e., when the first and the second PMOS signal switch FETs 24 and 26 are ON for the Signal_In to charge Cs, and to output CMOS supply voltage $V_{DD}$ from the bias node SB during the hold mode, i.e., when the PMOS signal switch FETs are open to isolate Signal_In from Cs. Functions, principles of operation, and benefits provided by this biasing sequence are described in greater detail at later sections.

As will also be described in greater detail at later sections, the depicted example arrangement of components and their respective arrangement in the example circuit 30 represent functions, not a physical structure or physical arrangement of the components, either with respect to each or with respect to the physical components implementing other functions and elements depicted in FIG. 1.

With continuing reference to FIG. 1, the example PMOS bias sequencer circuit 30 may be implemented by a switching circuit topology represented as a stack of an ON-OFF switch SW1 and ON-OFF switch SW3. In the depicted example, when the CLK is ON (i.e., at GND in the depicted example) in a sampling mode, SW1 is closed. NCLK is OFF when CLK is ON and, therefore, SW3 is OFF during the sampling mode. As result, through the example topology of switches SW1 and SW3 depicted in the FIG. 1 example PMOS bias sequencer circuit 30, in the sampling mode, the first and the second PMOS signal switch FETs 24 and 26 are ON, i.e., in a conducting state, and their respective bodies b1 and b2 are connected to the input node A, thereby biasing these to the Signal_In voltage.

This described biasing of the PMOS signal switch FETs 24 and 26 during the sampling mode provides, among other features benefits, a significant lowering of the ON resistance encountered by the Signal_In signal passing through the PMOS FETs 24 and 26.

With continuing reference to FIG. 1, when the CLK changes to its OFF state (i.e., goes to $V_{DD}$), the example 10 switches to the hold mode. The CLK places the $V_{DD}$ voltage at the gates of the first and the second PMOS signal switch FETs 24 and 26, which turns the FETs OFF. Concurrently with the CLK going from ON to OFF, its complementary NCLK goes from OFF to ON. In response, switch SW1 opens and switch SW3 closes, and this connects the bias node SB to the $V_{DD}$ supply and, via the PMOS body bias supply line 28 to the body connections b1 and b2, biases the bodies of the first and the second PMOS switch transistors 24, 26 to the $V_{DD}$ supply.

The resulting reverse biasing of the first and the second PMOS signal switch FETs heavily isolates any change at the input node A from the output node B. The signal stored on the capacitor "Cs" is therefore kept until an arrival of the next OFF to ON edge (not depicted in the drawings) of the sampling clock CLK.

Figure 2:
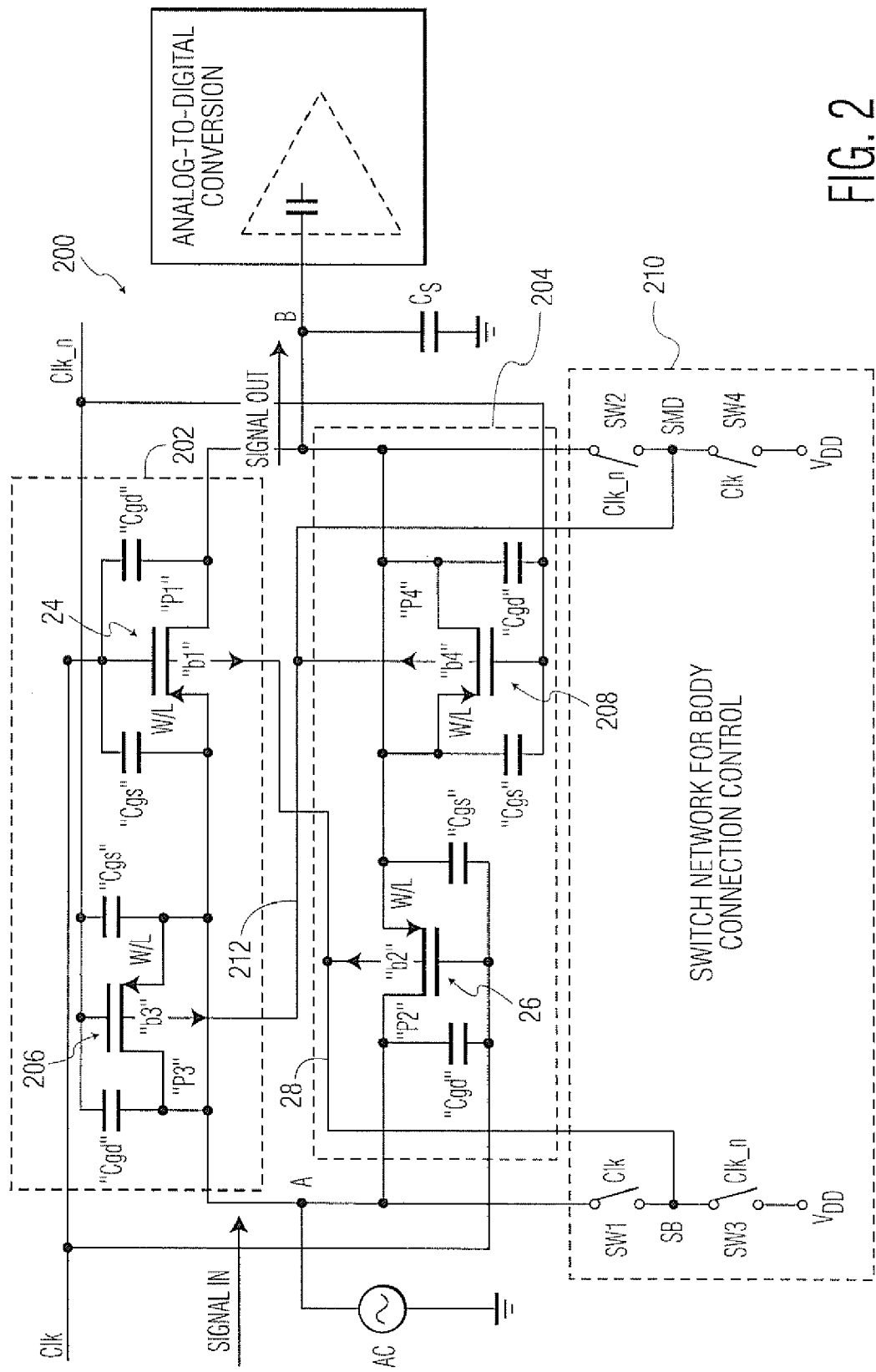
FIG. 2 is a circuit diagram representation of one example implementation of one switched body PMOS S/H switch having switched body PMOS dummy FETs, according to one or more embodiments.

FIG. 2 is a circuit diagram representation of one example implementation 200 of one switched body PMOS S/H switch having switched body PMOS dummy FETs, according to one or more embodiments. The example 200 may be, but is not necessarily built as an addition on structure of the FIG. 1 example 10. To assist in understanding the concepts of embodiments such as the example 200, however, the example is described as an addition to the FIG. 1 example 10, with all like parts having like reference labels and, except where otherwise stated or made otherwise clear from the context, all like parts performing like operations to accomplish like functions.

Referring to FIG. 2, the example 200 replaces the FIG. 1 first and second branches 12 and 18 with first and second branches 202 and 204, respectively. First branch 202 inserts a first PMOS dummy FET 206 in series with the first PMOS signal switch FET 24 and, similarly but not identically, second branch 204 inserts a second PMOS dummy FET 208 in series with the second PMOS signal switch FET 26. The second PMOS dummy FET 208 is not identically arranged as the first PMOS dummy FET because, for purposes and further to functions described in greater detail at later sections, the first PMOS dummy FET 206 is connected on the path from the input node A to the first PMOS signal switch FET 24, while the second PMOS dummy FET 208 is connected on the path between the second PMOS signal switch FET 26 and the output node B. The source and the drain of each of the first and the second PMOS dummy FETs are shorted together, hence the name "dummy FET," by, for example, a conductor (represented as a line, but not separately numbered) connecting the source and the drain outside the dummy FET.

With continuing reference to FIG. 2, the first and the second PMOS signal switch FETs 24 and 26 have respective body connections b1 and b2, as previously described in reference to the FIG. 1 example 10 according to one embodiment. The first and the second PMOS dummy FETs 206 and 208 have similar respective body connections, labeled "b3" and "b4," respectively. A FET body complementary bias sequencer circuit 210, hereinafter referenced as "complementary bias sequencer 210," substitutes for the signal switch transistor bias sequencer circuit 30 of the FIG. 1 example 10. The depicted example complementary bias sequencer 210 includes the pair of switches SW1 and SW3 described previously and the body connections b1 and b2 of the first and the second PMOS switch FETs 24 and 26 are, as previously described, connected via, for example, the previously described switch FET bias line 28, to the switch pair SW1 and SW3. The first and the second PMOS signal switch FETs are therefore biased in relation to the sampling mode and hold mode by, for example, operation of the CLK and NCLK, as previously described. The example complementary bias sequencer 210 further includes a second stack of switches SW2 and SW4, arranged to generate a certain bias voltage on a dummy FET bias node labeled arbitrarily as "SMD." This connects via a dummy FET bias line 212 to the body connections b3 and b4 of the first and the second PMOS dummy FETs 206 and 208, respectively. For purposes described in greater detail at later sections, the bias sequence and levels for the first and the second PMOS dummy FETs 206 and 208 are generally complementary to the bias sequence and levels of the first and the second PMOS signal switch FETs 24 and 26.

Referring to FIG. 2, the gates (not separately numbered) of the first and the second PMOS dummy FETs 206 and 208 are controlled by an inverse of the sample and hold CLK, which may be the above-described NCLK. As will be described in greater detail at later sections, preferably the edges of the CLK and NCLK signals have minimum deviation, particularly the rising edge of the CLK, which switches the example 200 from the sample to the hold mode, in relation to the corresponding falling edge of NCLK.

With continuing reference to FIG. 2, in the sampling mode (the interval where the CLK is at GND), switch SW2 is OFF and SW4 is ON. The body connections b3 and b4 are therefore biased at the $V_{DD}$, in contrast to the body connections b1 and b2 of the first and the second PMOS signal switch FETs being biased at the Signal_In voltage. Concurrently with the CLK being at GND, NCLK is at $V_{DD}$, switching OFF the first and the second PMOS dummy FETs 206 and 208. When the circuit 200 switches to the hold mode at the rising edge of the CLK to the $V_{DD}$, switch SW2 is switched ON and SW4 is switched OFF. As shown in FIG. 2, the result is the body connections b3 and b4 of the first and the second PMOS dummy FETs being switched to the output node B which, if a hold capacitor Cs is attached, is the held signal. Concurrently with CLK going to $V_{DD}$, NCLK goes to GND and the first and the second PMOS dummy FETs 206 and 208 are switched ON.

Preferably, for readily understood reasons that are described in greater detail at later sections, the geometry, the performance-related dimensions and the physical implementation orientation of the first and the second PMOS dummy FETs 206 and 208 are identical, or substantially identical, to the geometry, the performance-related dimensions and the physical implementation orientation of the first and the second PMOS signal switch FETs 24 and 26. Referring to FIG. 2, this preferable structural relation is represented by the first and the second PMOS signal switch FETs 24 and 26, and the first and the second PMOS dummy FETs 206 and 208, all being labeled with the same "W/L" label, where "W/L" represents "width" and "length" as these terms are used in the FET arts relevant to these embodiments. As far as the meaning of "identical," it will be understood that numeric ranges and particular physical parameters are application-dependent, and that persons of ordinary skill in the arts pertaining to S/H devices, applying ordinary know-how and ordinary standards of engineering practice to the present disclosure, can readily and sufficiently identify specific tolerances, numeric ranges and the like to meet the application.

An example method according to one embodiment, using illustrative operations described as performed on the FIG. 2 example 200 for purposes of reference, will be described. Persons of ordinary skill in the arts pertaining to S/H devices will, upon reading this disclosure in its entirety, have an understanding of its concepts and related advances in compensating both the charge injection effect and the clock feedthrough effect, sufficient to further practice methods according to one or more of the embodiments.

First, a characteristic of a turned-on PMOS switch, such as the PMOS signal switch FETs 24 and 26, is that a conductive channel exists underneath the gate. The conductive channel is formed by a gate-to-body voltage low enough to collect positive charges from the N-well and form a high concentration layer (i.e., channel) at the surface of the N-well facing the gate. This leaves a depletion area at the interface between the channel and the N-well. When the gate voltage of the PMOS signal switch FETs 24 and 26 is raised from GND to $V_{DD}$ the electric field maintaining the above-described conducting channel and the depletion region ceases. This, of course, switches the PMOS switch from ON to OFF. Concurrently, because the electric field maintaining the conducting channel is ceased, the positive charges that formed the conducting channel must go somewhere. Some may dissipate to the N-well. However, various factors including, in particular, the above-described depletion region with the same electric field polarity as the charge in the channel prevent much of the positive charges stored in the channel from migrating back into the N-well and, instead, a substantial portion of these positive charges are exuded through the source and the drain. The exuding charges form a short duration, substantially charge injection to the input node A and to the output node B. The short duration charge injection to the input node A introduces an over-shoot voltage and the settling time of this over-shoot voltage is decided by the voltage level and the sourcing and draining current capability of the input signal source. More importantly, the short duration charge injection to the output node introduces a signal dependent offset which may be a significant source of nonlinearity errors. This nonlinearity error is called the "channel charge injection effect."

An illustrative example of operations and methods on the FIG. 2 example S/H feed circuit 200 shows the embodiments' provided benefits and feature that include cancelling the above-described channel charge injection effect.

Referring now to the example FIG. 2 example 200, during the sampling mode (i.e., when the CLK is ON) the first and the second PMOS signal switch FETs 24 and 26 are ON. Conductive channels are therefore formed under the gates of these FETs 24 and 26. The total charge in each channel, designated as "Qs", is determined by the dimension of the device, the gate-to-source voltage difference $V_{GS}$ ($V_{GS}=V_G-V_S$) and the threshold voltage "$V_{TH}$". The $V_{TH}$ voltage is a function of the work function between the gate material and the bulk silicon in the channel region, the Fermi potential, the depletion-layer charge, the positive charge due to impurities and imperfections at the interface, the gate capacitance and the source-to-body bias ($V_{SB}$). It will be understood that $V_{SB}$ may be zero in circuits according to the embodiments, because the body bias level of the PMOS signal switch FETs same as the signal voltage level shown at the input node A at the rising edge of the CLK, such as the body connection b1 of the first PMOS signal switch FET 24 may be connected to its source and the body connection b2 of the second PMOS signal switch FET 26 may have the same voltage level as its source connecting to the output node B, where the input signal is sampled and fully settled when the sampling CLK rising edge comes.

Continuing to refer to the FIG. 2 example 200, with respect to the PMOS dummy FETs 206 and 208, during the sampling mode NCLK is OFF (which is $V_{DD}$) and, therefore, these FETs are turned OFF. Their respective body connections b3 and b4, as described above, become reversely biased by the $V_{DD}$ supply potential. The reverse bias causes a reversed bias p-n junction in each of 206 and 208 and, therefore creates a depletion region around their respective source and drain areas. The charge, arbitrarily labeled herein as "Qh," that was extant in the N-well (later on called the depletion region) of the dummy PMOS FETs 206, 208 at the rising edge of NCLK dissipated within a short interval after that edge. Because of the depletion region formed by the reverse biasing of the bodies of FETs 206 and 208, the charge Qh is excluded out of the source and the drain of each of the dummy PMOS FETs 206, 208 and then distributed between the signal source providing input signal to the input node A and Cs. However, since in the sampling mode, there is a DC path from the output node B to the signal source due to the first and the second PMOS signal switch FETs 24 and 26 ON, the sampled voltage on the sampling capacitor Cs is eventually forced to the value same as Signal_in, not determined by charge Qh.

When the CLK changes from GND to $V_{DD}$, the circuit 200 changes to a hold mode, isolating the input node A from the output node B because the first and the second PMOS signal switch FETs 24 and 26 are turned OFF. The channels formed in the FETs 24 and 26 during the sample mode then disappear, and the total charge "Qs" in each channel is excluded to the input node A and the output node B. Concurrently, as previously described, the CLK changing to OFF and NCLK changing to ON controls the switches SW1 and SW3 to connect $V_{DD}$ to the body connections b1 and b2, via line 28, setting $V_{SB}$ to a negative voltage $V_S-V_{DD}$. This is the same as described above for the PMOS dummy FETs 206 and 208 during the sampling mode (as FETs 206, 208 are reverse biased during that mode). This reverse bias on the PMOS FETs 24 and 26 during the hold mode creates a depletion region under their gates.

Assuming the physical dimensions, geometry and other parameter values of the PMOS FETs 24 and 26 are the same as the corresponding physical dimensions, geometry and other parameters of the PMOS dummy FETs 206 and 208, the charge from the newly generated depletion region in the PMOS FETs 24 and 26 is equal to Qh. As previously described, Qh is also rejected to the input node A and output node B. The total charge that shows up at the input node A and the output node B, from the switching OFF of the PMOS FETs 24 and 26, is therefore Qs+Qh. Concurrent with the switching OFF of the PMOS FETs 24 and 26, the PMOS dummy FETs 206 and 208 are switched ON, from the reverse biased depletion state to the ON state, because NCLK feeding the gates of 206, 208 goes to GND. The switches SW2 and SW4 also change, under control of the CLK and NCLK, to bias the bodies of 206 and 208 to the voltage on the output node B, where is the sampled signal stored in the Cs capacitor. As a result, a channel is built up under the gates of 206 and 208. It will be understood that each new instance of these channels being created channel absorbs charge Qs and, in addition, the charge Qh is needed to fill in the depletion region that was generated in the PMOS dummy transistors 206, 208 in the sampling mode.

As will be understood by persons of ordinary skill in the art from the above description, when a S/H feed circuit according to the FIG. 2 example 200 (having the physical parameters of the PMOS dummy FETs 206, 208 matched to those of the PMOS signal switch FETs 24, 26) switches from the sample to the hold state, the total charge absorbed by the PMOS dummy FETs is Qs+Qh. This exactly equals the above-described total charge injected from the channel and the depletion region of the PMOS signal switch FETs 24 and 26 during the hold mode.

Therefore, as can be readily seen, in the described sample-and-hold operations on S/H devices according to the FIG. 2 example 200, no additional charge is added on Cs and neither is any offset introduced. Therefore, among other features and benefits of S/H feed circuits according to the FIG. 2 example 200 is that the "channel charge injection effect" of the PMOS signal switch FETs connecting between the input node A and the output node B, such as FETs 24 and 26, may be fully compensated.

A clock feedthrough effect cancellation within sample-and-hold devices according to the FIG. 2 example 200, and provided by S/H operations and methods performed on S/H devices according to the embodiments, will be described. Ordinarily, absent the dummy FETs 206 and 208, depicted embodiments, one type of clock feedthrough results from the voltage variation of the CLK changing states (i.e., the CLK edges) being coupled to the sampling capacitor Cs and to the input node A through the gate-to-source/gate-to-drain parasitic capacitors of the PMOS signal switch FETs 24 and 26. Referring to FIG. 2, these parasitic capacitances are shown and are labeled modeled elements "Cgs" and "Cgd."

As previously described in reference to FIG. 2, at the sample to hold transition the CLK signal toggles from GND to $V_{DD}$. The voltage variation $V_{DD}$ of the CLK is then coupled to the output node B via the parasitic capacitor "Cgd" of the first PMOS signal switch FET 24, and via the "Cgs" of the second PMOS signal switch FET 26, and is then redistributed among them and the hold capacitor Cs. Absent an arrangement of dummy FETs or equivalents such as the FIG. 2 PMOS dummy transistors 206 and 208, the gates biasing generally complementary to the gates biasing of the PMOS signal switch FETs 24 and 26, this generates an offset that may be termed as $+V_{OFF\_SW}$. In addition, for similar reasons, absent the above described features of a S/H feed circuit such as the FIG. 2 example 200, the voltage variation $V_{DD}$ of the CLK during the sample to hold transition is coupled to the input node A via the depicted parasitic capacitor "Cgs" of the first PMOS signal switch FET 24 and by the depicted parasitic capacitor "Cgd" of the second PMOS signal switch FET 26. As can be understood by a person of ordinary skill in the art, this coupling introduces a positive glitch.

Referring now to FIG. 2, concurrent with the above-described toggling of the CLK signal from GND to $V_{DD}$ initiating a change from the sample mode to the hold mode, the NCLK connected to the gates of the PMOS dummy transistors 206, 208 toggles from $V_{DD}$ to GND. The PMOS dummy transistors 206 and 208, being, according to one preferred embodiment, structurally substantially identical to the PMOS signal switch FETs 24 and 26 though, have the substantially the same "Cgs" and "Cgd" values as the PMOS signal switch FETs 24 and 26. Therefore, referring to the PMOS dummy FET 208, a resulting voltage variation at the gate of that FET 208, which is equal to $-V_{DD}$, is coupled to the output node B through the FETs parasitic capacitors "Cgs" and "Cgd", and then shared between them and the Cs holding capacitor. This generates another offset, which may be arbitrarily labeled as "$-V_{OFF\_DUMMY}$".

Similarly, referring to the PMOS dummy FET 206, when the NCLK connected to its gate toggles from $V_{DD}$ to GND, the voltage variation is coupled, via "Cgs" and "Cgd" of the FET 206, and goes to the input node A, introducing negative glitch.

As described above, according to at least one above-described embodiment that is exampled by the FIG. 2 S/H feed circuit 200, the PMOS signal switch FETs 24 and 26, and the PMOS dummy FETs 206 and 208 may be structured, and arranged in physical relation to one another, such that "Cgs" and "Cgd" of the second PMOS dummy FET 208 is equal to the "Cgs" of the second PMOS signal switch FET 26, and "Cgd" of the first PMOS signal switch FET 24, and "Cgs" and "Cgd" of the first PMOS dummy FET 206 are equal, respectively, to "Cgs" of the first PMOS signal switch FET 24 and to "Cgd" of the second PMOS signal switch FET 26.

Therefore, the sum of "$+V_{OFF\_SW}$" and "$-V_{OFF\_DUMMY}$" may be zero and, accordingly, both of the following benefits and features are provided: the offset on Cs may be cancelled, and the glitch may be eliminated. Then the clock feedthrough effect may therefore eliminated. Even though, subject to mismatch between the PMOS signal switch FETs 24 and 26 and the PMOS dummy FETs 206 and 208, the clock feedthrough effect will be reduced at least to the level constrained by the process mismatch between FETs 24 and 26 and FETs 206 and 208.

Applications contemplated for S/H feed circuits according to the above-described embodiments include a sample and hold of a common mode voltage, defined as one half of the supply potential $V_{DD}$, to maximize the dynamic range in switch capacitor circuits, and the analog signal swinging around the common mode level with limited variation range. Preferably, all of the switch-body devices, i.e., FETs 24, 26, 206 and 208 employ only PMOS FETs. Preferably, there are no NMOS FETs in the signal path and, therefore no occurrence of a negative glitch at the input node A can turn a switch ON and potentially leak the charge stored on the holding capacitor Cs, which would introduce another offset. Preferably, if any NMOS devices (not shown in FIG. 1 or 2) are used, such as, for example, in the bias sequencer 30 of FIG. 1 or the bias sequence 210 of FIG. 2, body connection switching network, these may be constructed on the P-substrate in which the N-wells for PMOS FETs 24, 26, 206 and 208 are formed, and the bodies of any such NMOS FETs are preferably biased by the ground potential. Therefore, if any such NMOS devices are used, no separate P-well is needed. This provides a further benefit in that implementing a S/H device switch according to these embodiments may be done using a simple, if not the simplest digital CMOS process.

Figure 3:
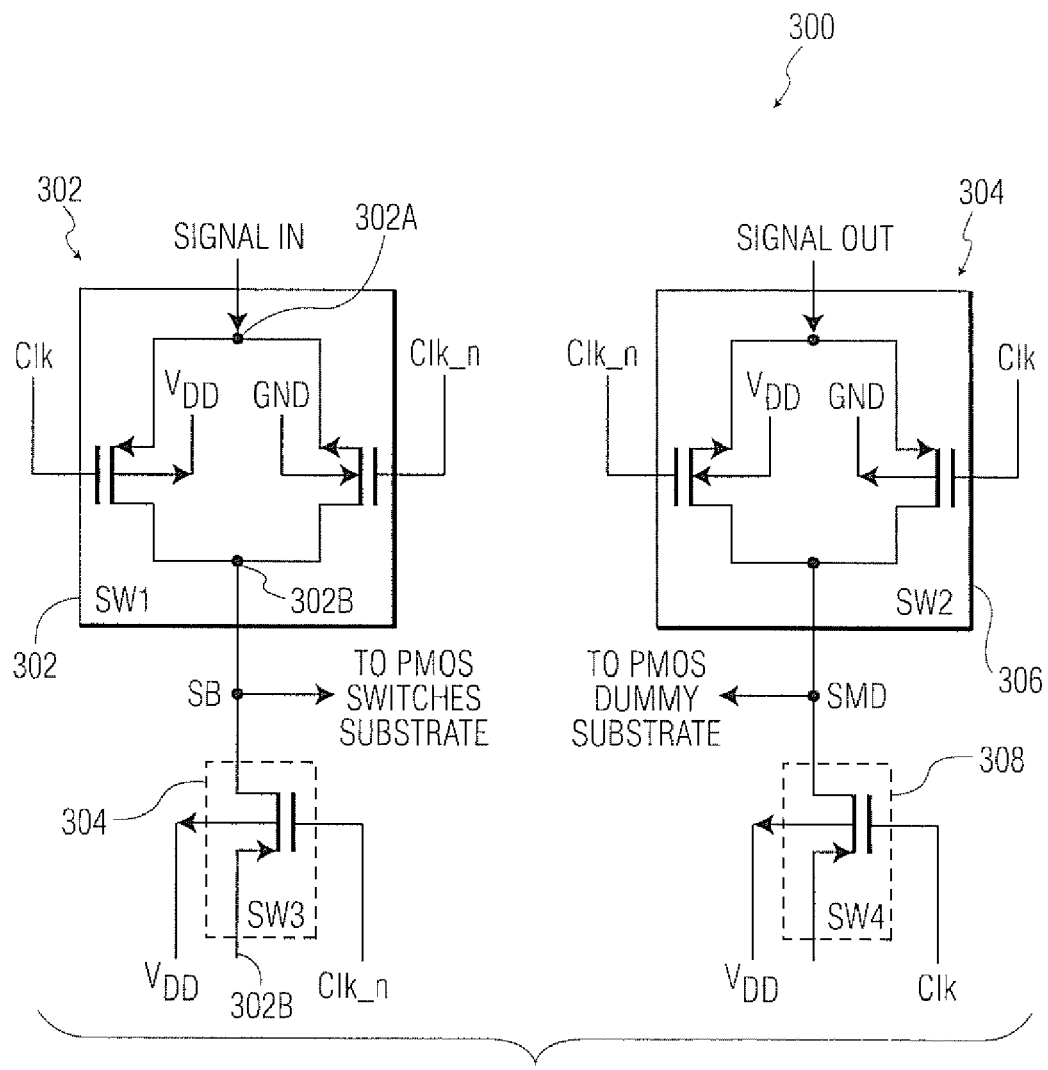
FIG. 3 is a circuit diagram representation of one example implementation of one switch network configured to control, in response to a sample-and-hold clock and an inverted sample-and-hold clock, a sequenced switching of the bias of the bodies of a PMOS switch element of one example implementation according to one or more embodiments.

FIG. 3 shows an example configuration 300 that may implement the complementary bias sequencer circuit 210 in the FIG. 2 example circuit 200.

Referring to FIG. 3, the example 300 includes a stacked arrangement of a CMOS switch 302 and a PMOS FET switch 304 to generate the bias voltage to the body connections b1 and b2 of the PMOS signal switch FETs 24 and 26. In the stacked arrangement of 302 and 304, the end 302A of the CMOS switch 302 may be connected to the FIG. 2 input node A (not shown in FIG. 3), the other end 302B may be connected to the drain 304D of the PMOS FET 304, and the source 304S of the PMOS FET may be connected to $V_{DD}$. The depicted connection between the end 302B of the CMOS switch 302 and the drain 304D of the PMOS FET may form the node SB shown in FIG. 2, which feeds the body connections b1 and b2 of the PMOS signal switch FETs 24 and 26. As can be seen, when CLK is ON (which is GND) the CMOS switch 302 is ON and, since NCLK is OFF, the PMOS FET switch 304 is OFF. The node SB is therefore connected to the input node A, to receive the Signal_In. When the CLK is OFF and the NCLK is ON, the states of 302 and 304 are reversed and the node SB is connected through the PMOS FET switch 304 to $V_{DD}$. The depicted stack of the CMOS switch 302 and the PMOS FET switch 304 may also implement the bias sequencer 30 of the FIG. 1 example S/H feed circuit 10 according to one embodiment.

Continuing to refer to FIG. 3, the example 300 may also include a stacked arrangement of a CMOS switch 306 and a PMOS FET switch 308 to generate the bias voltage feeding the body connections b3 and b4 of the PMOS dummy transistors 206 and 208. The operation is similar to the above-described operation of the stacked arrangement of the CMOS switch 302 and the PMOS FET switch 304. When the NCLK is ON (which is GND) the CMOS switch 306 is ON and, since CLK is OFF, the PMOS FET switch 308 is OFF. The node SMD is therefore connected to the output node B, to receive the signal stored on the sampling capacitor Cs. When the NCLK is OFF and the CLK is ON, the states of 306 and 308 are reversed and the node SMD is connected through the PMOS FET switch 308 to $V_{DD}$.

It will be understood that FIG. 3 shows a circuit functional block diagram, and may not be representative of a preferred physical arrangement of the switches SW1 through SW4 in relation to the PMOS signal switch FETs 24 and 26 and/or the PMOS dummy transistors 206 and 208.

According to one aspect of one or more embodiments, the following physical arrangement of components forming the FIG. 3 example 300, in relation to components forming a S/H feed circuit having an embodiment as depicted at FIG. 2 may be preferable: the CMOS switch 302 implementation of SW1 may preferably be located between the bodies of the PMOS signal switch FETs 24 and 26 and the input node A; the PMOS switch 304 implementation of SW3 may preferably be located between the bodies of the PMOS signal switch FETs 24 and 26 and the $V_{DD}$ supply; the CMOS switch 306 implementation of SW2 may preferably be located between the bodies of the PMOS dummy FETs 206 and 208 and the output node B; and the PMOS FET 308 implementation of SW4 may preferably be located between the bodies of the PMOS dummy FETs 206, 208 and the supply rail $V_{DD}$.

Continuing to refer to FIG. 3, bodies of the PMOS devices used in the example switching network 300 may be biased by the $V_{DD}$ supply potential and the bodies of the NMOS devices (not separately numbered) within the CMOS switches 302 and 306 may be biased by the GND potential.

Figure 4:
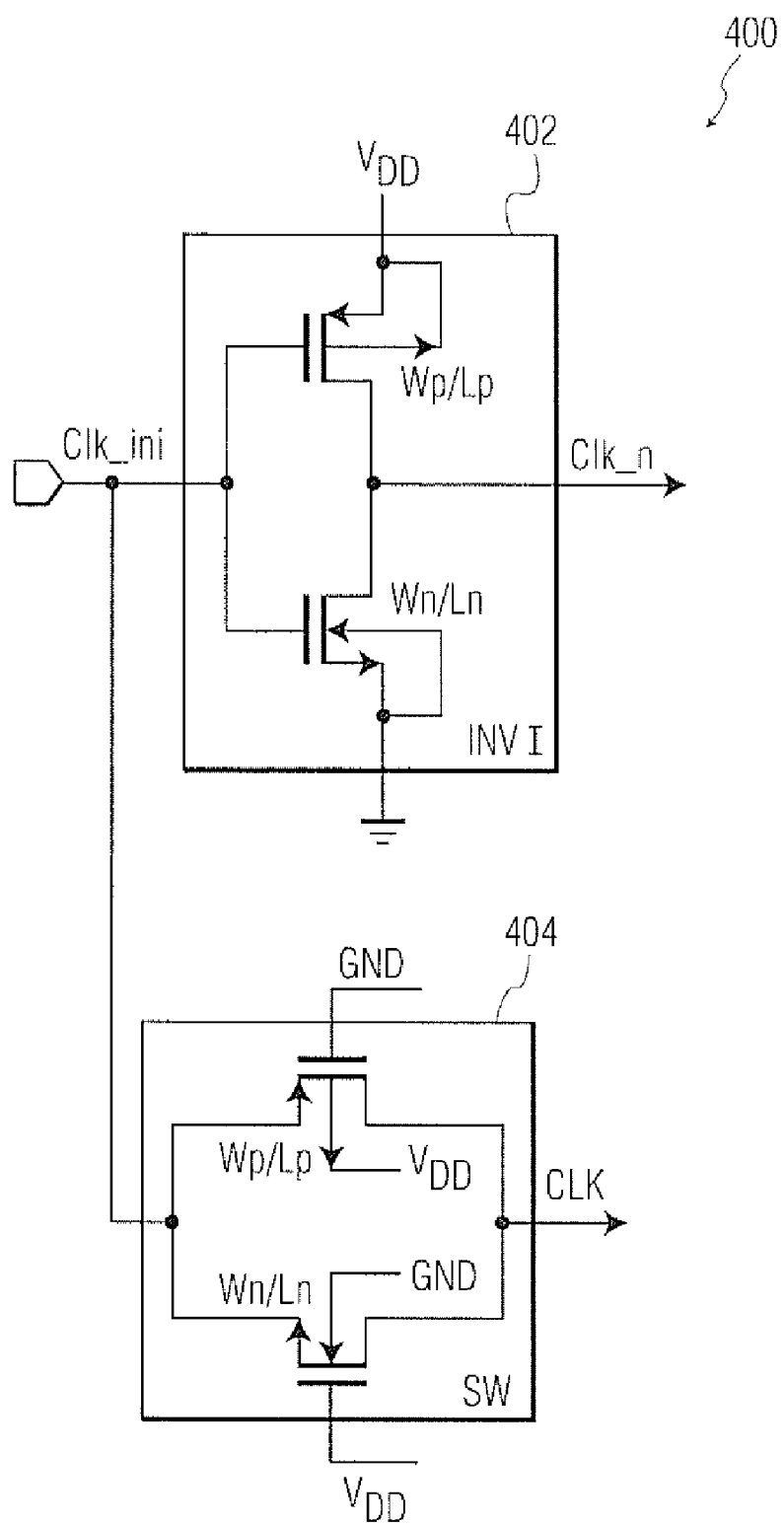
FIG. 4 is a circuit diagram representation of one example implementation of one generating circuit for one example sample-and-hold clock signal and synchronized inverted sample-and-hold clock signal.

FIG. 4 shows a circuit diagram of one implementation 400 of a sample-and-hold control signal generation circuit to generate CLK and NCLK from a given CLK_IN. Referring to FIG. 4, the example 400 includes an inverter 402 formed of a stack of a PMOS FET (illustrated but not separately numbered) and an NMOS FET (illustrated but not separately numbered) connected between $V_{DD}$ and GND, and an always-on buffer 404 formed of a parallel connection of a PMOS pass transistor (illustrated but not separately numbered) and an NMOS pass transistor (illustrated but not separately numbered).

Continuing to refer to FIG. 4, in the example inverter 402, the source of the PMOS FET is connected to $V_{DD}$ and the drain of the PMOS FET is connected to the drain of the NMOS FET, that connection being a midpoint from which the NCLK is generated. The source of the NMOS FET of the inverter 402 is connected to GND. The given CLK_IN connects to the gates of both FETs in the inverter 402. As readily seen, of CLK_IN is at $V_{DD}$, the PMOS FET is OFF and the NMOS FET is ON, thereby the junction from which the NCLK signal is generated connecting to GND. The NCLK is therefore an inverted, and delayed, version of the CLK_IN signal. NCLK is delayed because of the inherent switching delay of the FETs forming the inverter 402. The amount of delay may be arbitrarily referenced as DL1 units of time.

With continuing reference to FIG. 4, the always-on buffer 404 generates CLK as a delayed, non-inverted, version of the CLK_IN signal. The amount of delay, DL2, is preferably identical to DL1 by, for example, forming the FETs of the buffer 404 to have the same, approximately the same physical parameters as relative physical arrangement as the FETs of the inverter 402. The buffer 404 is always on because the gate of its PMOS FET is connected to GND and its body is biased at $V_{DD}$, and the gate of NMOS FET is connected to $V_{DD}$ with its body biased at GND. The buffer 404 FETs are therefore strongly ON, such that the CLK signal swings through the full GND to $V_{DD}$ range.

The tolerance, in terms of a fixed range, or in terms of statistics, between the DL1 and DL2 is application dependent, readily specified or identified by a person of ordinary skill in the art of S/H devices upon reading this disclosure, in view of the particular application. As readily understood by such persons, the maximum difference between DL1 and DL2 may be identified by modeling the circuit on, for example, SPICE, with the model specifying, or calculating, factors identifiable by such persons upon reading this disclosure such as, for example, the above-described Qh and Qs charge associated with the PMOS signal switch FETs (e.g., PMOS FETs 24 and 26) and their associated PMOS dummy FETs (e.g. FETs 206 and 208), the switching characteristics of each these FETs, the "Cgs" and "Cgd" values of each of these FETs, and relevant trace line delays and impedances.

As also readily understood by persons of ordinary skill in the art upon reading this disclosure, the maximum difference between DL1 and DL2, as well as the differences between the CLK and NCLK edges at various points throughout the actually implemented circuit, will affect the matching between the charge injections, and glitches exhibited by the operational signal switch PMOS FETs, such as the PMOS FETs 24 and 26, and the above-described counter-acting charge injections, and glitches exhibited by the PMOS dummy FETs, such as the PMOS dummy FETs 206 and 208, when arranged and operated in accordance with the above-described embodiments.

Figure 5:
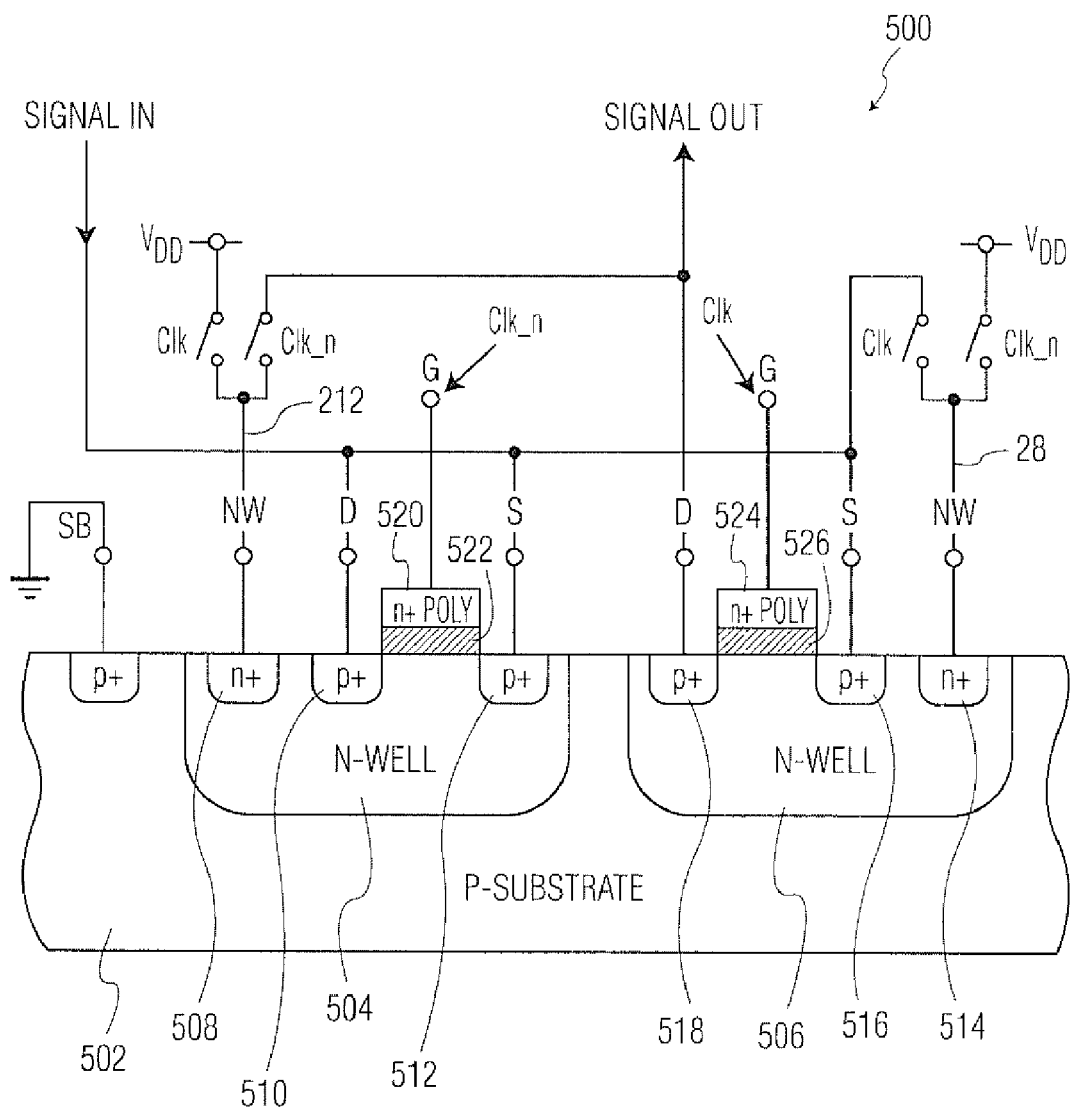
FIG. 5 is an illustration of one example abstracted cross-sectional view of one example branch of a PMOS signal switch FET element and corresponding PMOS dummy FET element of one example implementation according to one or more embodiments.

FIG. 5 is an illustration of one example abstracted cross-sectional view 500 of one example branch of a S/H feed switch according to, for illustrative example, the example branch 202 of the FIG. 2 illustrative example 200. Referring to FIG. 5, the example is formed on a P-substrate 502, having a first N-well 504 and a second N-well 506. The first N-well 504 may implement the body of the first PMOS dummy FET 206 and the second N-well may implement the body of the first PMOS signal switch FET 24. The first N-well 504 may contain an n+ implant 508 forming the body connection b3 of the first PMOS dummy FET 206, and p+ implants 510 and 512 forming the drain and the source (not numbered in FIG. 2) of the FET 206. Similarly, the second N-well 506 may contain an n+ implant 514 forming the body connection b1 of the first PMOS signal switch FET 24, and p+ implants 516 and 518 forming the source and the drain (not numbered in FIG. 2) of the FET 24.

With continuing reference to FIG. 5, the n+ implant 508 forming the body connection b3 of the first PMOS dummy FET 206 may connect to a bias line such as, for example, the bias line 212 of FIG. 2 and, similarly, the n+ implant 514 forming the body connection b1 of the first PMOS signal switch FET 24 may connect to a bias line such as, for example, the bias line 28 of FIG. 2. A gate formed of an n+ poly 520 above a dielectric insulator layer 522 formed on the N-well 504 may connect to NCLK to form the gate of the first PMOS dummy FET 206 and, as shown in FIG. 2, may connect to the NCLK signal. Likewise, a gate formed of an n+ poly 524 above a dielectric insulator layer 526 formed on the N-well 506 may connect to the CLK signal to form the gate of the first. PMOS signal switch FET 24 and, as shown in FIG. 2.

Preferably, but not necessarily, the P-substrate 502 is biased by a p+ implant 528 connected to GND.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be affected while remaining within the spirit and scope of the invention.

Accordingly, the foregoing disclosure, description, and figures are for illustrative purposes only and do not in any way limit the invention, which is defined only by the claims.

We hereby claim:

1. A sample/hold feed switch for switchably connecting and isolating an input node connectable to signal source for receiving an input signal, to and from an output node connectable to a sampling capacitor for holding a sample of the input signal, comprising:
    a first signal branch connected at one end to the input node and at the other end to the output node, having a first PMOS signal switch FET and a first PMOS dummy FET, the first PMOS signal switch FET having a corresponding switch FET body connection and the first PMOS dummy FET having a corresponding dummy FET body connection, a first gate-to-source capacitance connected to the first PMOS signal switch FET, a first gate-to-drain capacitance connected to the first PMOS signal switch FET, a second gate-to-source capacitance connected to the first PMOS dummy FET, and a second gate-to-drain capacitance connected to the first PMOS dummy FET;
    a second signal branch connected at one end to the input node and at the other end to the output node, having a second PMOS signal switch FET and a second PMOS dummy FET, the second PMOS signal switch FET having a corresponding switch FET body connection and the second PMOS dummy FET having a corresponding dummy FET body connection, a third gate-to-source capacitance connected to the second PMOS signal switch FET, a third gate-to-drain capacitance connected to the second PMOS signal switch FET, a fourth gate-to-source capacitance connected to the second PMOS dummy FET, and a fourth gate-to-drain capacitance connected to the second PMOS dummy FET;
    a switch FET bias switching sequencer connected to the switch FET body connections to switch the switch FET body connections of the PMOS signal switch FETs between the input node and a $V_{DD}$ supply;
    a dummy FET bias switching sequencer connected to the dummy FET body connections to switch the dummy FET body connections of the PMOS dummy FETs between the output node and the $V_{DD}$; and
    a clock generator circuit, connected to the switch FETs and to the gates of the dummy FETs, that generates a clock signal (CLK) switching between a sample state voltage and a hold state voltage, generates an inverse of the CLK (NCLK), and inputs to said switch FETs and said dummy FETs CLK and NCLK to control the switch FETs and to control the dummy FETs to switch from a first operation state to a second operation state;
    wherein the sampling capacitor, the first and third gate-to-source capacitances, and the first and third gate-to-drain capacitances produce a switch offset voltage, the sampling capacitor, the second and fourth gate-to-source capacitances, and the second and fourth gate-to-drain capacitances produce a dummy offset voltage, and the dummy offset voltage is approximately equal to the switch offset voltage.

2. The sample/hold feed switch of claim 1, wherein the first PMOS signal switch FET has a gate connected to said CLK signal, and a source connected to the input node, a drain connected to the output node, said FET configured to form a conducting channel between said source and said drain in response to said CLK being at the sampling state voltage, and to remove said conducting channel in response to said CLK being at the hold state voltage,
    wherein the second PMOS signal switch FET has a gate connected said CLK signal, and a source connected to the output node, a drain connected to the input node, said FET configured to form a conducting channel between said source and said drain in response to said CLK being at the sampling state voltage and to remove said conducting channel in response to said CLK being at the hold state voltage.

3. The sample/hold feed switch of claim 1,
    wherein the first PMOS dummy FET has a gate connected to said NCLK, a source connected directly to the source of the first PMOS signal switch FET, a drain connected directly to the input node, the source and the drain connected by a low impedance metal wire located between the source of the first PMOS signal switch FET and the input node, and
    wherein the second PMOS dummy FET has a gate connected to said NCLK, a source connected directly to the source of the second PMOS signal switch FET, a drain connected directly to the output node, the source and the drain connected by a low impedance metal wire located between the source of the second PMOS signal switch FET and the output node.

4. the sample/hold feed switch of claim 1, wherein the drain and source of the first PMOS dummy are each connected directly to the input node.

5. the sample/hold feed switch of claim 1, wherein the drain and source of the second PMOS dummy are each connected directly to the output node.

6. The sample/hold feed switch of claim 1, wherein the clock generator circuit receives a given clock signal CLK_IN to generate CLK and NCLK in response, said clock generator circuit including:
    an inverter formed by one PMOS transistor having a given PMOS transistor size and one NMOS transistor having a given NMOS transistor size to receive the CLK_IN and, in response, generate said NCLK, and an always-on buffer to receive said CLK_IN and, in response, to generate said CLK, said always-on buffer formed by a PMOS transistor having said given PMOS transistor size and an NMOS transistor having said given NMOS transistor size.

7. The sample/hold feed switch of claim 1,
    wherein the first PMOS signal switch FET has a given geometry, given performance-related dimensions and a given physical implementation orientation, and
    wherein each of the second PMOS signal switch FET, the first PMOS dummy FET in the first signal branch, and the second PMOS dummy FET in the second signal branch has a geometry, performance-related dimensions, and a physical implementation the same as said given geometry, said given performance-related dimensions and said given physical implementation orientation.

8. The sample/hold feed switch of claim 7, wherein the first and second PMOS dummy FETs, upon a switch in operation state, absorb a charge equal to the sum of a conductive channel charge ($Q_s$) produced when the PMOS signal switch FETs are conducting a depletion charge ($Q_h$) produced when the PMOS dummy switches are not conducting.

9. The sample/hold feed switch of claim 1, wherein the input signal comprises a common-mode voltage.

10. The sample/hold feed switch of claim 1, wherein the switch FET bias switching sequencer comprises:
   a first switch controlled by said CLK to switch between an ON state connecting the input node to the switch FET body connections of the first and the second PMOS signal switch FETs in response to said CLK in said sampling state voltage, and an OFF state disconnecting the input node from the switch FET body connections of the first and the second PMOS signal switch FETs in response to said CLK in said hold state voltage; and
   a second switch controlled by said NCLK, having an ON state connecting the $V_{DD}$ node to the FET switch body connections of the first and the second PMOS signal switch FETs in response to said CLK in said hold state voltage, and an OFF state disconnecting the $V_{DD}$ node from the FET switch body connections of the first and the second PMOS signal switch FETs in response to said CLK in said sample state voltage.

11. The sample/hold feed switch of claim 10, wherein the first switch controlled by the CLK is located between the bodies of the first and second PMOS signal switch FETs and the input node, and further wherein the second switch controlled by the NCLK is located between the bodies of the first and second PMOS signal switch FETs and the $V_{DD}$ supply.

12. The sample/hold feed switch of claim 10, wherein the dummy FET bias switching sequencer further comprises:
   a first switch controlled by said NCLK to switch between an ON state connecting the output node to the dummy FET body connections of the first and the second PMOS dummy FETs in response to said CLK in said hold state voltage, and an OFF state disconnecting the output node from the dummy FET body connections of the first and the second PMOS dummy FETs in response to said CLK in said sampling state voltage,
   a second switch controlled by said CLK having an ON state connecting the $V_{DD}$ node to the dummy FET body connections of the first and the second PMOS dummy FETs in response to said CLK in said sampling state voltage, and an OFF state disconnecting the $V_{DD}$ node from the dummy FET body connections of the first and the second PMOS dummy FETs in response to said CLK in said hold state voltage.

13. The sample/hold feed switch of claim 1, wherein the dummy FET bias switching sequencer comprises:
   a first switch controlled by said NCLK to switch between an ON state connecting the output node to the dummy FET body connections of the first and the second PMOS dummy FETs in response to said CLK in said hold state voltage, and an OFF state disconnecting the output node from the dummy FET body connections of the first and the second PMOS dummy FETs in response to said CLK in said sampling state voltage, and
   a second switch controlled by said CLK having an ON state connecting the $V_{DD}$ node to the dummy FET body connections of the first and the second PMOS dummy FETs in response to said CLK in said sampling state voltage, and an OFF state disconnecting the $V_{DD}$ node from the dummy FET body connections of the first and the second PMOS dummy FETs in response to said CLK in said hold state voltage.

14. The sample/hold feed switch of claim 13, wherein the first switch controlled by the NCLK is located between the bodies of the first and second PMOS dummy FETs and the output node, and further wherein the second switch controlled by the CLK is located between the bodies of the first and second PMOS dummy FETs and the $V_{DD}$ supply.

* * * * *